(12) United States Patent
Morishima (10) Patent No.: US 9,012,017 B2
(45) Date of Patent: Apr. 21, 2015

(54) BARRIER LAYER-ATTACHED SUBSTRATE, DISPLAY COMPONENT, AND METHOD FOR MANUFACTURING DISPLAY COMPONENT

(75) Inventor: Shinichi Morishima, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 909 days.

(21) Appl. No.: 12/671,102

(22) PCT Filed: Jul. 24, 2008

(86) PCT No.: PCT/JP2008/063298
§ 371 (c)(1),
(2), (4) Date: Jan. 28, 2010

(87) PCT Pub. No.: WO2009/017032
PCT Pub. Date: Feb. 5, 2009

(65) Prior Publication Data
US 2010/0196679 A1 Aug. 5, 2010

(30) Foreign Application Priority Data

Jul. 31, 2007 (JP) .................................. 2007-199906

(51) Int. Cl.
H05B 33/02 (2006.01)
H01L 51/52 (2006.01)
H05B 33/04 (2006.01)
H05B 33/10 (2006.01)

(52) U.S. Cl.
CPC ..... *H01L 51/5237* (2013.01); *H01L 2251/5338* (2013.01); *H01L 2251/566* (2013.01); *H05B 33/04* (2013.01); *H05B 33/10* (2013.01)

(58) Field of Classification Search
USPC .................... 428/195.1, 201, 68; 156/250, 60
See application file for complete search history.

(56) References Cited

U.S. PATENT DOCUMENTS 6,492,026 B1 12/2002 Graff et al.
7,667,395 B2 2/2010 Hayashi
(Continued)

FOREIGN PATENT DOCUMENTS

CN 1636258 A 7/2005
CN 1815751 A 8/2006
(Continued)

OTHER PUBLICATIONS

European Office Action in European Application No. 08791550.0 dated Oct. 24, 2011.
(Continued)

*Primary Examiner* — Bruce H Hess
*Assistant Examiner* — Christopher Polley
(74) *Attorney, Agent, or Firm* — Sughrue Mion, PLLC (57) ABSTRACT

A barrier layer-attached substrate according to the present invention is the barrier layer-attached substrate for a display component comprising: a barrier layer-attached substrate in which the barrier layers are formed on the substrate; a plurality of display elements formed on the barrier layer of the barrier layer-attached substrate; and an upper multilayer sealing film formed on the display elements so as to cover the display elements. And the barrier layer-attached substrate is characterized in that a plurality of the barrier layers are formed on the substrate into a divided pattern. With the use of the barrier layer-attached substrate of the present invention, a long-life display component of the present invention can be manufactured.

15 Claims, 2 Drawing Sheets

(56) References Cited

U.S. PATENT DOCUMENTS

| | | |
|---|---|---|
| 2002/0140347 A1 | 10/2002 | Weaver |
| 2002/0176993 A1 | 11/2002 | Graff et al. |
| 2003/0064171 A1 | 4/2003 | Burrows et al. |
| 2005/0212419 A1 | 9/2005 | Vazan et al. |
| 2006/0158108 A1 | 7/2006 | Hayashi |
| 2007/0164376 A1 | 7/2007 | Burrows et al. |

FOREIGN PATENT DOCUMENTS

| | | |
|---|---|---|
| JP | 2003-531745 A | 10/2003 |
| JP | 2005-504652 A | 2/2005 |
| JP | 2006-222071 A | 8/2006 |
| WO | 03/028903 A2 | 4/2003 |
| WO | WO 2005101542 A1 | 10/2005 |

OTHER PUBLICATIONS

Japanese Office Action mailed Jun. 12, 2012, in Japanese Patent Application No. 2007-199906 with English translation.

Second Office Action issued May 15, 2012 in Chinese Patent Application No. 200880101003.7 with English translation.

Taiwanese Office Action issued in TW Application No. 097129058 dated Jun. 24, 2014.

Chinese Office Action issued in CN Application No. 200880101003.7, dated Apr. 2, 2014.

Korean Office Action issued in corresponding KR Application No. 10-2010-7002110, dated Jun. 12, 2014.

BARRIER LAYER-ATTACHED SUBSTRATE, DISPLAY COMPONENT, AND METHOD FOR MANUFACTURING DISPLAY COMPONENT

TECHNICAL FIELD

The present invention relates to a barrier layer-attached substrate, a display component, and a method for manufacturing the display component. More in detail, the present invention relates to a barrier layer-attached substrate, a display component using the barrier layer-attached substrate, and a method for manufacturing the display component, in which after laminating lamination elements such as a barrier layer, a display element, and an upper multilayer sealing film, on the substrate, the sealing performance of the display component manufactured by cutting the stacked substrate into an element unit is not impaired by the cutting operation.

BACKGROUND ART

In a display component such as an organic electroluminescence element (hereinafter, may be referred to as an "organic EL element"), a light-emitting diode display component, a liquid crystal display component, or an electrophoretic ink display component, the display element is formed on a substrate and a sealing film is stacked so as to cover the display element. With regard to a conventional display component, a glass substrate has been used as the substrate; however, use of a plastic substrate has begun to meet demands for weight reduction of elements, improvement of impact resistance, producing an large area of element, improvement of production efficiency, and the like (for example, Patent Document 1).

In an organic EL element, the display element is constituted by a stacked body having an anode, a cathode, and an organic electroluminescence light-emitting layer (hereinafter, may be referred to as an "organic EL light-emitting layer") formed between these electrodes.

A plastic substrate is flexible, is easily available with a large area, and facilitates cutting process to divide the plastic substrate into each component element after laminating a plurality of element members. A plastic substrate disadvantageously has higher permeability to gas and liquid than that of a glass substrate. A display material (in an organic EL element, a material constituting an organic EL light-emitting layer) wrapped with a substrate and an upper multilayer sealing film is easily oxidized and is easily deteriorated when contacted with water. For this reason, when a plastic substrate is used, a barrier layer with high barrier properties against gas and liquid is stacked on the substrate, a plurality of display elements are formed on the barrier layer, and then an upper sealing layer is stacked so as to cover the stacked display elements.

The barrier layer is generally formed with substantially the same constitution and substantially the same material as those of the upper multilayer sealing film and therefore may be called a lower sealing film. These barrier layer and upper multilayer sealing film generally have at least one inorganic layer and at least one organic layer. The number of lamination is determined as necessary, and basically an inorganic layer and an organic layer are stacked alternatively.

Particularly, when a flexible substrate is used, the size of the substrate can be enlarged. Thus, a large number of display elements are patterned to be formed on the large-area substrate, and then these patterned display parts are collectively sealed with a multilayer sealing film. Subsequently, by cutting the substrate, the formed substrate is made into an element unit which is appropriate to the sites where the elements are mounted. The details are described below with reference to FIG. 1 and FIG. 2.

Figure 1:
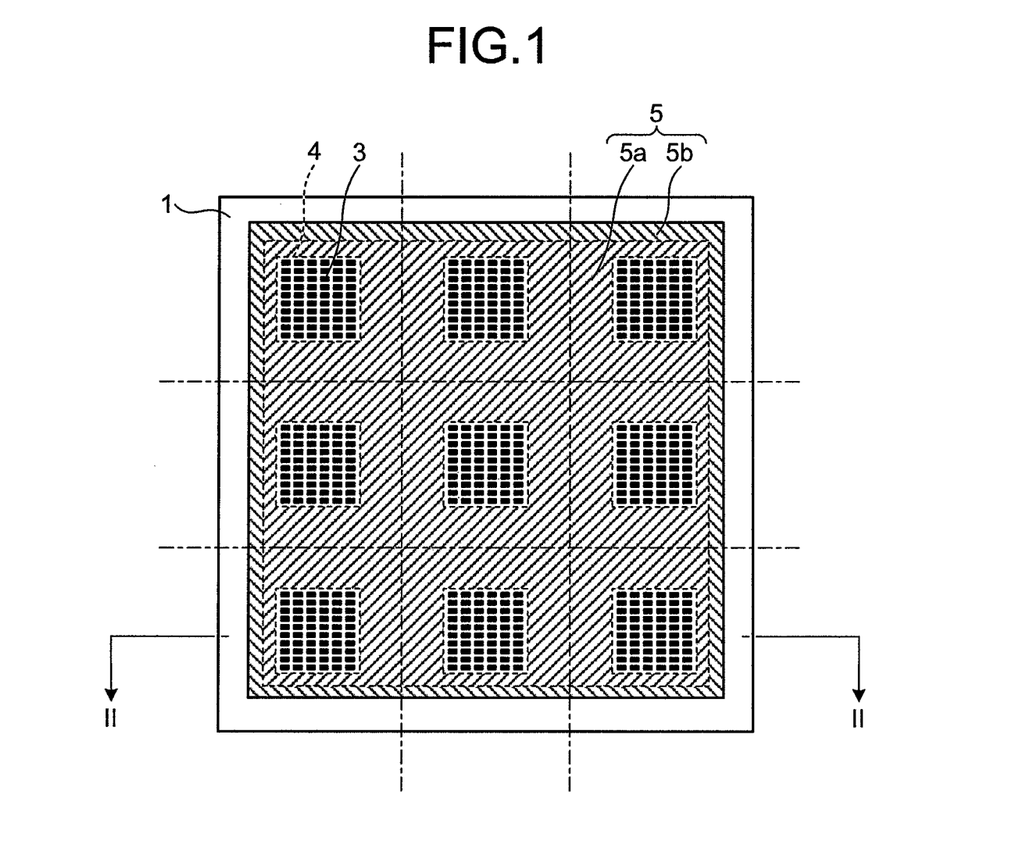
FIG. 1 is an exemplary plane schematic of a conventional display component.
Figure 2:
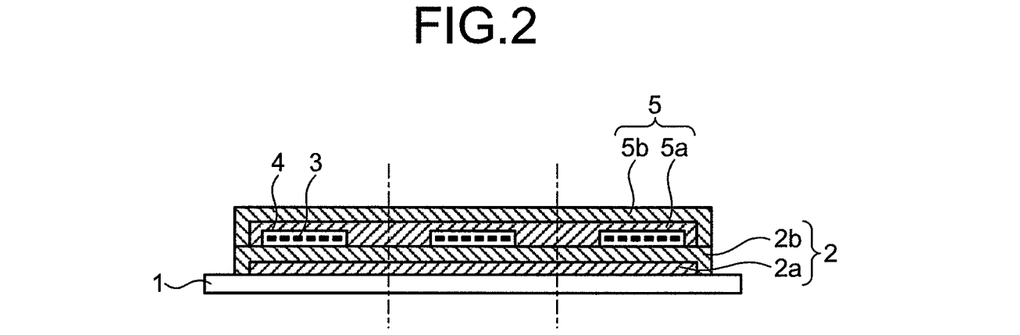
FIG. 2 is a sectional schematic along the line II-II of FIG. 1.

As shown in FIGS. 1 and 2, a barrier layer 2 is stacked on a large-area flexible substrate 1 to enhance the gas permeability resistance and the moisture permeability resistance of the flexible substrate (hereinafter, the substrate stacked with the barrier layer may be referred to as a "substrate with a barrier layer"). One or more display elements 3 are disposed to be formed on the barrier layer on the substrate with a barrier layer in a predetermined pattern. A plurality of display parts 4 are formed by this disposition. The barrier layer 2 is formed with at least one organic layer film 2a and at least one inorganic layer film 2b (in the figures, for simplifying illustration, a barrier layer is shown as to be formed with having each one layer).

An upper multilayer sealing film 5 is formed so as to collectively cover the display parts 4 formed on the barrier layer 2. The upper multilayer sealing film 5 is formed with having at least one organic layer 5a and at least one inorganic layer 5b (in the figures, for simplifying illustration, similar to the barrier layer 2, an upper multilayer sealing film is shown as to be formed with having each one layer).

After the upper multilayer sealing film 5 is formed, the formed substrate is cut along cutting lines shown in the figures as alternate long and short dashed lines to be divided into a plurality of display component units, each of which has one display part 4. The divided each unit is mounted on an electronic device to which the elements are applied, such as an illuminating device or an information display device, to be in practical use.

Patent Document 1: JP2003-531745 A

DISCLOSURE OF INVENTION

Problem to be Solved by the Invention

As described above, in a conventional display component and a manufacturing method thereof, a plurality of display parts are formed on a large-area substrate with a barrier layer, and the display parts are collectively sealed with a multilayer sealing film, and then, the substrate is cut into each element unit. In the process of making into units, the multilayer barrier layer and the multilayer sealing film are cut in their thickness directions. As the result of this, a cutting plane of each multilayer film is in a state of exposing inorganic films and organic films, both of which constitute each multilayer film. Because the organic film has relatively high gas permeability and moisture permeability, gas and moisture may infiltrate from the cutting plane with time and alter display materials such as organic EL materials constituting the display elements, and thus, display properties are deteriorated. Furthermore, the cutting process for making into each unit is performed as forcible cutting; therefore, the cutting plane may be cracked and the interface between the organic films and inorganic films may be peeled. Due to such a mechanical damage, the infiltration of gas and moisture occurs more rapidly, and the lifetime of the component becomes shorter.

To solve the problems described above, it is an object of the present invention to provide a barrier layer-attached substrate with which the lifetime of a display component can be extended, the display component in which the lifetime is extended by employing the barrier layer-attached substrate, and a manufacturing method of the display component.

Means for Solving Problem

To accomplish the above described object, the present invention provides a barrier layer-attached substrate, a display element, and a manufacturing method of the display element, by employing the following elements.

[1] A barrier layer-attached substrate comprising: a substrate; and barrier layers, wherein the barrier layers are formed on the substrate in the form of a plurally divided pattern, wherein the barrier layer-attached substrate is for use in a display component having a plurality of display elements on the barrier layers.

[2] The barrier layer-attached substrate according to the above [1], wherein the barrier layer is a multilayer film comprising at least one inorganic layer and at least one organic layer.

[3] The barrier layer-attached substrate according to the above [2], in the barrier layer, wherein the inorganic layer stacked at a side opposite to the substrate of the organic layer covers an edge of the organic layer stacked at a side facing the substrate of the inorganic layer.

[4] The barrier layer-attached substrate according to any one of the above [1] to [3], wherein the substrate is a flexible substrate.

[5] The barrier layer-attached substrate according to any one of the [1] to [5], which is used for an organic EL element.

[6] A display component comprising: a barrier layer-attached substrate in which barrier layers are formed on a substrate, a plurality of display elements which are formed on the barrier layer of the barrier layer-attached substrate, and an upper multilayer sealing film formed on the display elements configured to cover the display elements, wherein the barrier layers are formed on the substrate in the form of a plurally divided pattern.

[7] The display component according to the above [6], wherein the barrier layer is a multilayer film comprising at least one inorganic layer and at least one organic layer.

[8] The display component according to the above [7], in the barrier layer, wherein the inorganic layer stacked at an side opposite to the substrate of the organic layer covers an edge of the organic layer stacked at a side facing the substrate of the inorganic layer.

[9] The display component according to any one of the above [6] to [8], wherein the display elements and the upper multilayer sealing film are formed on each of the barrier layers in the form of the plurally divided pattern.

[10] The display component according to any one of the above [6] to [9], wherein the upper multilayer sealing film is a multilayer film comprising at least one inorganic layer and at least one organic layer.

[11] The display component according to the above [10], in the upper multilayer sealing film, wherein the inorganic layer stacked at a side opposite to the substrate of the organic layer covers an edge of the organic layer stacked at a side facing the display elements of the inorganic layer.

[12] The display component according to the any one of the above [6] to [11], wherein the substrate is a flexible substrate.

[13] The display component according to the above [6] to [12], which is an organic EL element.

[14] A method for manufacturing a display component that has a barrier layer-attached substrate in which barrier layers are formed on a substrate, a plurality of display elements which are formed on the barrier layer of the barrier layer-attached substrate, and an upper multilayer sealing film formed on the display elements configured to cover the display elements, the method comprising:

forming the barrier layers in the form of a plurally areas divided separately each other.

[15] The method for manufacturing a display component according to the above [14], wherein the forming the barrier layers comprises stacking at least one inorganic layer and at least one organic layer.

[16] The method for manufacturing a display component according to the above [15], wherein the forming barrier layers comprises stacking the inorganic layer stacked at a side opposite to the substrate of the organic layer so as to cover an edge of the organic layer stacked at a side facing substrate of the inorganic layer.

[17] The method for manufacturing a display component according to the above [14] to [16], comprising: forming the display elements and the upper multilayer sealing film on each of the barrier layers in the form plurally divided.

[18] The method for manufacturing a display component according to the above [14] to [17], wherein the upper multilayer sealing film was formed by stacking at least one inorganic layer and at least one organic layer.

[19] The method for manufacturing a display component according to the above [18], wherein the forming the upper multilayer sealing film comprises stacking the inorganic layer stacked at a side opposite to the display elements of the organic layer so as to cover an edge of the organic layer stacked at a side facing the display elements of the inorganic layer.

[20] The method for manufacturing a display component according to any one of [14] to [19], comprising: after forming the upper multilayer sealing film, cutting the substrate in each unit divided along the barrier layers, to obtain a display component for use in mounting.

[21] The method for manufacturing a display component according to any one of the above [14] to [20], wherein a flexible substrate is employed as the substrate.

[22] The manufacturing method of a display component according to the above [14] to [21], wherein the display component is an organic EL element.

Effect of the Invention

The barrier layer-attached substrate according to the present invention is formed by providing barrier layers in the form of a divided pattern on the substrate. With the use of the barrier layer-attached substrate, a long-life display component can be manufactured. The display component of the present invention has the barrier layer-attached substrate, thereby its lifetime is significantly improved. In addition, since the barrier layer-attached substrate is used in the method, a manufacturing method of the display component according to the present invention can provide a long-life display component.

EXPLANATIONS OF LETTERS OR NUMERALS

10 barrier layer-attached substrate substrate
11 barrier layer (lower multilayer sealing film)
12a organic layer of barrier layer
12b inorganic layer of barrier layer 13 display element
14 display part
15 upper multilayer sealing film
15a organic layer of upper multilayer sealing film
15b inorganic layer of upper multilayer sealing film

BEST MODES FOR CARRYING OUT THE
INVENTION

A barrier layer-attached substrate, a display component, and a method manufacturing for the display component according to an embodiment of the present invention are described below in more detail with reference to FIG. 3 and FIG. 4. For easy understanding, the contraction scale of each member in the figures in the present specification may be different from its actual scale. The present invention is not limited by the following descriptions. Various changes and modifications may be made without departing from the object and scope of the present invention. An organic EL element has other members such as lead wires for electrodes; however, in the present specification the description and the illustration of the members are omitted, because the members are not directory needed for the explanation of the present invention. For convenience of explanation, in the illustration of the layered structure of an organic EL element, a substrate is disposed at the bottom; however, the organic EL element of the present invention is not limited to being manufactured or used in the illustrated disposition.

Figure 3:
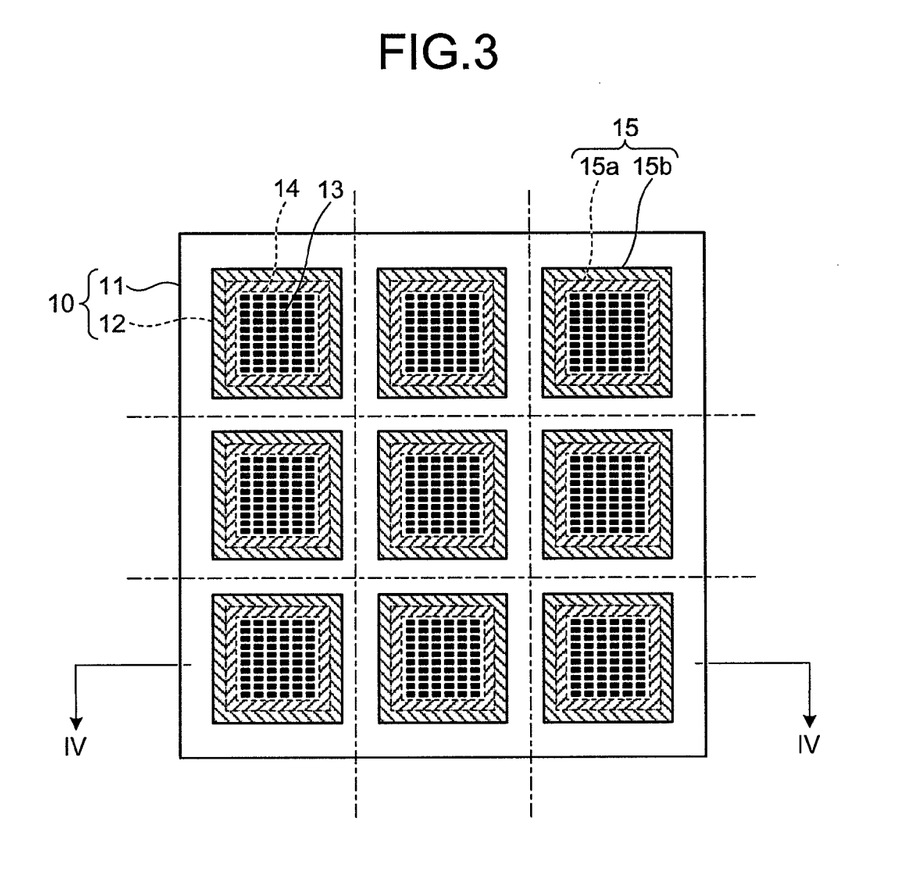
FIG. 3 is an exemplary plane schematic of a display component according to the present invention.
Figure 4:
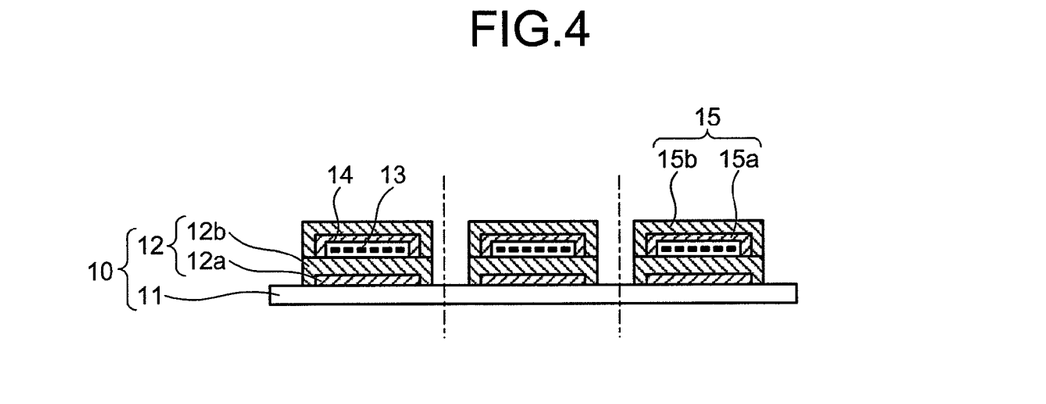
FIG. 4 is a sectional schematic along line IV-IV of FIG. 3.

As shown in FIGS. 3 and 4, the barrier layer-attached substrate 10 according to the present embodiment is formed by stacking a plurality of barrier layers 12 set to have a predetermined area with a predetermined interval from each other on a large-area flexible substrate 11. Each of the barrier layers 12 is formed with having at least one organic layer film 12a and at least one inorganic layer 12b (in the figures, for simplifying illustration, a barrier layer is shown as to be formed with each one layer).

One or more display elements 13 (for example, in an organic EL element, the display element is formed with having an anode, a cathode, and an organic EL light-emitting layer formed between these electrodes) are arranged and stacked in a predetermined pattern on each of the barrier layers 12 formed on the barrier layer-attached substrate 10. According to this disposition, a display part 14 is formed.

An upper multilayer sealing film 15 is stacked only on the upper area of each of the barrier layers 12 so as to cover the display part 14 formed on each of the barrier layers 12. The upper multilayer sealing film 15 is formed with at least one organic layer 15a and at least one inorganic layer 15b (in the figures, for simplifying illustration, similar to the barrier layer 12, it is formed with each one layer).

After the upper multilayer sealing film 15 that covers the display element 13 formed on each of the barrier layers 12 is formed, the substrate is cut along the cutting lines shown by alternate long and short dashed lines in the figures to be divided into a plurality of display component units (display components for mounting), each of which has a single display part 14. The portions of the cutting lines are in the areas in which neither the barrier layer 12 nor the upper sealing layer 15 is present, which results in cutting only the substrate 11. The substrate 11 can be divided without being subjected to damages such as cracks due to the cutting operation. Generally, a plastic flexible substrate is used as the substrate 11. When a flexible substrate is used, the cutting operation becomes much easier and the distortion stress to the substrate due to the cutting operation is likely relieved. In each of the divided units of the display components as shown in FIG. 4, in both of the barrier layer 12 and the upper multilayer sealing film 15, the whole of the organic layers 12a and 15a remain to be completely covered by the inorganic layers 12b and 15b without being exposed. Therefore, the display part 14 is in a state of being completely covered with the inorganic layers 12b and 15b excellent in the sealing ability, which prevents penetration of external gas (oxygen) and moisture to the display element 13 located inside. Because of this, the display component for mounting achieves long lifetime.

According to the present embodiment, barrier layer to be formed on a substrate may be directly stacked on the substrate or may be stacked with any intermediate layer interposed therebetween. As such an intermediate layer, for example, a lyophilic layer that makes the surface of the substrate to be lyophilic can be considered. Such a direct or indirect lamination relationship is similar to the formation relationship of barrier layer-display part-upper multilayer sealing film in the display component of the present invention. That is, the display part may be directly or indirectly formed on the barrier layer. Similarly, the upper multilayer sealing film to be formed on the display part may be directly or indirectly stacked on the display part. For example, an embodiment of the layered structure of an organic EL element has a multi-layered constitution stacked as follows: a flexible substrate/an (organic or inorganic) barrier pattern layer/an anode (for example, indium tin oxide (ITO))/a hole injection layer (for example, a $MoO_3$ film/a poly(3,4)ethylenedioxythiophene/polystyrene sulfonic acid film)/a polymer organic light-emitting material layer/an electron injection layer (for example, a Ba film)/a cathode layer (for example, an Al film)/an (organic or inorganic) upper multilayer sealing film. Besides the display element, a drive circuit such as a thin-film transistor (TFT), wirings, and the like necessary for driving the display element may be formed in a similar manner to the display element.

The thicknesses of the organic layer and the inorganic layer constituting the multilayer barrier layer and the upper multilayer sealing film are preferably in a range of 5 nanometers to 10 micrometers. When the thickness is less than 5 nanometers, it is difficult to keep the advantageous mechanical properties of the film; on the other hand, when the thickness exceeds 10 micrometers, the whole film thickness increases; then, those may cause an adverse effect on light extraction efficiency from the light-emitting layer in an organic EL element and the like.

(Constituent Materials of Multilayer Barrier Layer (Lower Multilayer Sealing Film) and Upper Multilayer Sealing Film)

As an inorganic layer constituting the multilayer barrier layer (lower multilayer sealing film) and the upper multilayer sealing film, inorganic oxides and inorganic nitrides such as silicon oxide ($SiO_2$), silicon nitride (SiN), silicon oxynitride (SiON), aluminium oxide ($Al_2O_3$), or aluminium nitride (AlN), are suitably used. As the forming method of the inorganic film, a well-known thin film forming method such as a sputtering method or a plasma chemical vapor deposition (plasma CVD) method may be used.

The sputtering method is one type of a thin film forming method and refers to a method which fine particles in an atomic or molecular size are collided with a target material (a material for a thin film) and the target material is discharged into a gas phase as fine particles and then the fine particles of the target material are accumulated on the predetermined surface of a substrate to form a thin film. Discharging the target material as fine particles into gas phase by colliding fine particles in an atomic or molecular size with a target material may be referred as sputtering.

A chemical vapor deposition (CVD) method is one type of a thin film forming method and refers to a method which raw material gas containing constituent elements of a thin film is supplied into a reaction chamber to cause a chemical reaction by adding energy such as heat or plasma and the reaction product is accumulated on the predetermined surface of a substrate to form a thin film.

As an organic layer constituting the multilayer barrier layer (lower multilayer sealing film) and the upper multilayer sealing film, mainly an organic monomer having a (meth)acryl group that has excellent adhesion with the inorganic layer material, that is, an acrylic polymer made by polymerizing (meth)acrylic compounds, is suitably used. The (meth)acrylic compounds refer to compounds containing acrylic acid, methacrylic acid, and esters thereof as constitutional units.

The (meth)acrylic compound is made into a coating by a well-known coating forming method such as a solution coating method and a spray coating method. The coating is irradiated with optical energy (chemical rays such as electron beams, plasma beams, and ultraviolet rays) or applied with heat energy to be polymerized, obtaining an acrylic polymer.

The (meth)acrylic compound is not particularly limited as long as it is a compound containing one or more (meth)acryl group in its molecule. When the (meth)acrylic compound has one (meth)acryl group, high adhesion with an inorganic layer can be obtained. When the (meth)acrylic compound has two or three (meth)acryl groups a crosslinking density becomes high and the film strength of an organic film is further enhanced.

Examples of the (meth)acrylic compound may include: compounds having a hydroxy group such as 2-hydroxyethyl (meth)acrylate, 2-hydroxypropyl(meth)acrylate, and 2-hydroxybutyl(meth)acrylate; compounds having an amino group such as dimethylaminoethyl(meth)acrylate and diethylaminoethyl(meth)acrylate; compounds having a carboxyl group such as (meth)acrylic acid, 2-(meth)acryloyloxyethyl succinic acid, and 2-(meth)acryloyloxyethyl hexahydrophthalic acid; (meth)acrylate having a cyclic skeleton such as glycidyl (meth)acrylate, tetrahydrofurfuryl(meth)acrylate, cyclohexyl(meth)acrylate, phenoxyethyl(meth)acrylate, and isobornyl(meth)acrylate; monofunctional acryl compounds such as isoamyl(meth)acrylate, lauryl(meth)acrylate, stearyl (meth)acrylate, butoxyethyl(meth)acrylate, ethoxydiethylene glycol(meth)acrylate, methoxytriethylene glycol(meth) acrylate, and methoxydipropylene glycol(meth)acrylate; an difunctional acryl compounds such as diethylene glycol di(meth)acrylate, 1,4-butanediol di(meth)acrylate, 1,6-hexanediol di(meth)acrylate, 1,9-nonanediol di(meth)acrylate, triethylene di(meth)acrylate, PEG#200 di(meth)acrylate, PEG#400 di(meth)acrylate, PEG#600 di(meth)acrylate, neopentyl di(meth)acrylate, and dimethyloltricyclodecane di(meth)acrylate; and difunctional (meth)acrylic compounds such as difunctional epoxy(meth)acrylate, and a difunctional urethane(meth)acrylate. Usable examples of compounds having three or more (meth)acrylic acids may include: an acrylic multifunctional monomer such as dipentaerythritol hexa(meth)acrylate, pentaerythritoltri(meth)acrylate, pentaerythritol tetra(meth)acrylate, trimethylolpropane triacrylate, and trimethylolpropane tetraacrylate; (meth)acrylic multifunctional epoxy acrylate; and (meth)acrylic multifunctional urethane acrylate.

The barrier layer-attached substrate, the display component, and the method for manufacturing the display component, involved with the above formation according to the present embodiment are particularly useful when the display component is an organic EL element. With regard to such the organic EL element, the formation of the multilayer sealing film as described above in detail is also similarly applied. Accordingly, the other main factors, such as a substrate or a light-emitting layer, of the formation for the organic EL element to which the present embodiment can be suitably applied are described below in detail.

(Substrate)

A substrate for use in the organic EL element is applicable so long as the substrate is unchanged while forming an electrode and forming the layer of an organic substance. Examples of the substrate to be used may include glass, plastic, a polymer film, a silicon substrate, and stacked materials obtained therefrom.

(Electrode and Light-Emitting Layer)

The basic structure of the organic EL element includes at least one light-emitting layer positioned between a pair of electrodes including an anode (first electrode) and a cathode (second electrode) in which at least the cathode has light transparency. For the light-emitting layer, low molecular and/or high molecular of organic light-emitting materials are used.

In the organic EL element, as layers other than the cathode, the anode, and the light-emitting layer, examples of members around the light-emitting layer may include a layer provided between the cathode and the light-emitting layer, and a layer provided between the anode and the light-emitting layer. Examples of the layer provided between the cathode and the light-emitting layer may include an electron injection layer, an electron transport layer, and a hole block layer.

The electron injection layer is a layer having a function to improve electron injection efficiency from the cathode. The electron transport layer is a layer having a function to improve the electron transport from the electron injection layer or the electron transport layer closer to the cathode to the light-emitting layer. When the electron injection layer or the electron transport layer has a function to block the transport of holes, these layers may be referred to as the hole block layer. The function to blocks the transport of holes can be confirmed, for example, by manufacturing a component in which only hole current flows and confirming an effect of blocking holes through the reduction of the current value obtained thereby.

Examples of the layer provided between the anode and the light-emitting layer may include a hole injection layer, a hole transport layer, and an electron block layer.

The hole injection layer is a layer having a function to improve hole injection efficiency from the cathode. The hole transport layer is a layer having a function to improve the hole transport from the hole injection layer or the hole transport layer closer to the anode to the light-emitting layer. When the hole injection layer or the hole transport layer has a function to block the transport of electrons, these layers may be referred to as the electron block layer. The function to block the transport of electrons can be confirmed, for example, by manufacturing a component in which only electron current flows and confirming an effect of blocking electrons through the reduction of the current value obtained thereby.

Examples of a formation of various combinations of layers around the light-emitting layer may include: a formation in which the hole transport layer is provided between the anode and the light-emitting layer; a formation in which the electron transport layer is provided between the cathode and the light-emitting layer; and a formation in which the electron transport layer is provided between the cathode and the light-emitting layer and the hole transport layer is provided between the anode and the light-emitting layer. Specifically, the following examples of structures a) to d) are shown.

a) Anode/Light-emitting layer/Cathode
b) Anode/Hole transport layer/Light-emitting layer/Cathode
c) Anode/Light-emitting layer/Electron transport layer/Cathode
d) Anode/Hole transport layer/Light-emitting layer/Electron transport layer/Cathode
(Here, a slash (/) indicates that each layer is adjacently stacked. The same definition is used hereinafter.)

As described above, the light-emitting layer is a layer having a light-emitting function, the hole transport layer is a layer having a hole transporting function, and the electron transport layer is a layer having an electron transporting function. The electron transport layer and the hole transport layer are collectively referred to as a charge transport layer. Each of the light-emitting layer, the hole transport layer, and the electron transport layer may independently employ two or more layers. Among the charge transport layers provided adjacently to the electrodes, a layer which has a function to improve charge injection efficiency from the electrodes and has an effect of lowering the driving voltage of the component, may be generally referred to as particularly a charge injection layer (a hole injection layer or an electron injection layer).

Further, the charge injection layer or an insulation layer having a film thickness of 2 nanometers or less may be provided adjacent to the electrodes to enhance the adhesion with the electrodes and improve the charge injection from the electrodes. A thin buffer layer may be inserted in the interface of the charge transport layer or the light-emitting layer to improve the adhesion at the interface and to prevent mixing. The order and the number of layers to be stacked and the thickness of each layer may be decided appropriately taking luminous efficiency and the lifetime of a component into consideration.

Examples of the organic EL element in which the charge injection layer (the electron injection layer, the hole injection layer) is provided may include: an organic EL element in which the charge injection layer is adjacently provided to the cathode; and an organic EL element in which the charge injection layer is adjacently provided to the anode. Specifically, the following examples of structures e) to p) are shown.
e) Anode/Charge injection layer/Light-emitting layer/Cathode
f) Anode/Light-emitting layer/Charge injection layer/Cathode
g) Anode/Charge injection layer/Light-emitting layer/Charge injection layer/Cathode
h) Anode/Charge injection layer/Hole transport layer/Light-emitting layer/Cathode
i) Anode/Hole transport layer/Light-emitting layer/Charge injection layer/Cathode
j) Anode/Charge injection layer/Hole transport layer/Light-emitting layer/Charge injection layer/Cathode
k) Anode/Charge injection layer/Light-emitting layer/Charge transport layer/Cathode
l) Anode/Light-emitting layer/Electron transport layer/Charge injection layer/Cathode
m) Anode/Charge injection layer/Light-emitting layer/Electron transport layer/Charge injection layer/Cathode
n) Anode/Charge injection layer/Hole transport layer/Light-emitting layer/Charge transport layer/Cathode
o) Anode/Hole transport layer/Light-emitting layer/Electron transport layer/Charge injection layer/Cathode
p) Anode/Charge injection layer/Hole transport layer/Light-emitting layer/Electron transport layer/Charge injection layer/Cathode In the examples of the layered structures indicated in (a) to (p), any of the embodiments in which the anode is provided at the side closer to the substrate, or in which the cathode is provided at the side closer to the substrate, may be employed.
(Anode)

For the above anode as an electrode having the light transparency, for example, those having a high electric conductivity such as a thin film of a metal oxide, metal sulphide, or a metal may be used, and the anode having a high transparency may be preferably utilized, and is used by being appropriately selected depending on the organic layer to be used. Specific examples of the anode to be used may include: a film produced by using electrically conductive glasses (such as NESA) made of indium oxide, zinc oxide, tin oxide, and a complex thereof such as indium tin oxide (ITO) and indium zinc oxide; gold; platinum; silver; and copper. Among them, ITO, indium zinc oxide, and tin oxide are preferred. Examples of the manufacturing method may include a vacuum deposition method, a sputtering method, an ion plating method, and a plating method. As the anode, an organic transparent conductive film such as polyaniline or a derivative thereof and polythiophene or a derivative thereof also may be used.

The film thickness of the anode may be appropriately selected in consideration of light transparency and electric conductivity, and is for example, 10 nanometers to 10 micrometers, preferably 20 nanometers to 1 micrometer, and more preferably 50 nanometers to 500 nanometers.
(Hole Injection Layer)

As described above, the hole injection layer may be provided between the anode and the hole transport layer or between the anode and the light-emitting layer. Examples of a material that forms the hole injection layer may include: phenylamines; starburst-type amines; phthalocyanines; oxide such as vanadium oxide, molybdenum oxide, ruthenium oxide, and aluminum oxide; amorphous carbon; polyaniline; and polythiophene derivatives.
(Hole Transport Layer)

Examples of materials that forms the hole transport layer may include: polyvinyl carbazole or derivatives thereof, polysilane or derivatives thereof, polysiloxane derivatives having an aromatic amine at the side chain or the main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, poly(p-phenylenevinylene) or derivatives thereof, and poly(2,5-thienylene vinylene) or derivatives thereof.

Among them, examples of hole transport materials to be used for the hole transport layer may include: preferably polymer materials such as polyvinyl carbazole or derivatives thereof, polysilane or derivatives thereof, polysiloxane derivatives having an aromatic amine compound group at the side chain or the main chain, polyaniline or derivatives thereof, polythiophene or derivatives thereof, polyarylamine or derivatives thereof, poly(p-phenylenevinylene) or derivatives thereof, or poly(2,5-thienylene vinylene) or derivatives thereof; and more preferably polyvinyl carbazole or derivatives thereof, polysilane or derivatives thereof, and polysiloxane derivatives having an aromatic amine at the side chain or the main chain. When the hole transport material is a low molecular material, the material is preferably used by being dispersed in a polymer binder.
(Light-Emitting Layer)

In the present embodiment, the light-emitting layer is an organic light-emitting layer, and generally contains an organic substance (a small compound and a large compound) that mainly emits fluorescence or phosphorescence. The light-emitting layer may further contain a dopant material.

Examples of materials that forms the light-emitting layer usable in the present embodiment may include the following materials.

(Light-Emitting Layer Forming Material 1: Pigment Materials)

Examples of pigment materials may include: cyclopendamine derivatives, tetraphenyl butadiene derivative compounds, triphenyl amine derivatives, oxadiazole derivatives, pyrazoloquinoline derivatives, distyrylbenzene derivatives, distyrylarylene derivatives, quinacridone derivatives, coumarin derivatives, pyrrole derivatives, thiophene ring compounds, pyridine ring compounds, pelynone derivatives, pelylene derivatives, oligothiophene derivatives, trifumanyl amine derivatives, oxadiazole dimmers, and pyrazoline dimmers.

(Light-Emitting Layer Forming Material 2: Metal Complex Materials)

Examples of metal complex materials may include: metal complexes emitting from the triplet excited state such as iridium complexes and platinum complexes; and metal complexes such as aluminum quinolinol complexes, benzoquinolinol beryllium complexes, benzoxazolyl zinc complexes, benzothiazole zinc complexes, azomethyl zinc complexes, porphyrin zinc complexes, and europium complexes, which are complexes having Al, Zn, Be, or rare earth metals such as Tb, Eu, or Dy as the central metal and having oxadiazole, thiadiazole, phenylpyridine, phenylbenzoimidazole, or quinoline structure as the ligand.

(Light-Emitting Layer Forming Material 3: Polymer Materials)

Examples of polymer materials may include: polyparaphenylene vinylene derivatives, polythiophene derivatives, polyparaphenylene derivatives, polysilane derivatives, polyacetylene derivatives, polyfluorene derivatives, polyvinyl carbazole derivatives, and polymers formed from the above described pigments or metal-complex luminescent materials.

Among the light-emitting layer forming materials, examples of materials that emit blue light include: distyrylarylene derivatives, oxadiazole derivatives, and polymers thereof; polyvinyl carbazole derivatives; polyparaphenylene derivatives; and polyfluorene derivatives. Among them, polymer materials such as a polyvinyl carbazole derivative, a polyparaphenylene derivative, and a polyfluorene derivative, are preferred.

Among the light-emitting layer forming materials, examples of materials that emit green light may include: quinacridone derivatives, coumarin derivatives, polymers thereof, polyparaphenylene vinylene derivatives, and polyfluorene derivatives. Among them, polymer materials such as polyparaphenylene vinylene derivatives and polyfluorene derivatives are preferred.

Among the light-emitting layer forming materials, examples of materials that emit red light may include coumarin derivatives, thiophene ring compounds, and polymers thereof, polyparaphenylene vinylene derivatives, polythiophene derivatives, and polyfluorene derivatives. Among them, polymer materials such as polyparaphenylene vinylene derivatives, polythiophene derivatives and polyfluorene derivatives are preferred.

(Light-Emitting Layer Forming Material 4: Dopant Materials)

A dopant may be added to the light-emitting layer for the purpose such as enhancing the light-emitting efficiency and changing the wavelength of the light to be emitted. Examples of such dopants may include pelynone derivatives, coumarin derivatives, rubrene derivatives, quinacridone derivatives, squarylium derivatives, porphyrin derivatives, styryl dyes, tetracene derivatives, pyrazolone derivatives, decacyclene, and phenoxazon.

(Electron Transport Layer)

As materials that form the electron transport layer, publicly know materials may be used. Examples of the materials may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, 8-hydroxyquinoline or metal complexes of its derivatives, polyquinoline or derivatives thereof, polyquinoxaline or derivatives thereof, and polyfluorene or derivatives thereof.

Among them, oxadiazole derivatives, benzoquinone or derivatives thereof, anthraquinone or derivatives thereof, 8-hydroxyquinoline or metal complexes of its derivatives, polyquinoline or derivatives thereof, polyquinoxaline or derivatives thereof, and polyfluorene or derivatives thereof, are preferred, and 2-(4-biphenyl)-5-(4-t-butylphenyl)-1,3,4-oxadiazole, benzoquinone, anthraquinone, tris(8-quinolinol) aluminum, and polyquinoline are more preferred.

(Electron Injection Layer)

As described above, the electron injection layer is provided between the electron transport layer and the cathode or between the light-emitting layer and the cathode. According to the type of the light emitting layer, the following electron injection layers may be provided: an electron injection layer consisting of a monolayer structure of a Ca layer; or an electron injection layer consisting of a stacked structure that is composed of a Ca layer and a layer formed from any one or more members of metals belonging to Group IA and Group IIA of the Periodic Table (adopted by International Union of Pure and Applied Chemistry (IUPAC)) except Ca and having a work function of 1.5 eV to 3.0 eV, and oxides, halides, and carbonates of the above mentioned metals. Examples of the metals that have a work function of 1.5 eV to 3.0 eV and belong to Group IA of the Periodic Table or oxides, halides, or carbonates of those metals may include lithium, lithium fluoride, sodium oxide, lithium oxide, and lithium carbonate. Examples of the metals that have a work function of 1.5 eV to 3.0 eV and belong to Group IIA of the Periodic Table except Ca, or oxides, halides, or carbonates of those metals may include strontium, magnesium oxide, magnesium fluoride, strontium fluoride, barium fluoride, strontium oxide, and magnesium carbonate.

(Cathode)

Examples of the cathode as an electrode having light transparency may include: inorganic semiconductors such as metal, graphite or graphite interlayer compounds, and zinc oxide (ZnO); transparent conductive electrodes such as indium tin oxide (ITO) and indium zinc oxide (IZO); and metal oxide such as strontium oxide and barium oxide. Examples of the metals may include: alkali metals such as lithium, sodium, potassium, rubidium, and cesium; alkaline-earth metals such as beryllium, magnesium, calcium, strontium, and barium; transition metals such as gold, silver, platinum, copper, manganese, titanium, cobalt, nickel, and tungsten; tin, aluminum, scandium, vanadium, zinc, yttrium, indium, cerium, samarium, europium, terbium, and ytterbium; and an alloy of two or more of thereof. Examples of the alloys may include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys. The cathode may also be a stacked structure having two or more layers. Examples of the stacked structure may include a stacked structure made of the above metal, metal oxide, a fluoride, or the alloy thereof, with metals such as aluminum, silver, or chromium.

Examples

Examples of the present invention are described below. The examples described below are examples suitable for explaining the present invention and are not intended to limit the present invention. The examples described below are the manufacturing examples when a display component is an organic EL element.
(Formation of Lower Sealing Film)

The polyethylene naphthalate (PEN) film substrate having a thickness of 125 micrometers (trade name: Teonex 965A, manufactured by Teijin DuPont Films Japan Limited) was attached to a glass substrate, and then the surface treatment (lyophilic treatment) by the ultraviolet-ozone ($UV-O_3$) apparatus (trade name: Model 312 $UV-O_3$ cleaning system, manufactured by Technovision, Inc.) was performed. Subsequently, the substrate was placed in the film sealing apparatus (trade name: Guardian 200, manufactured by Vitex Systems Inc.) to form multilayer barrier layers (lower multilayer sealing film) according to the predetermined divided pattern as illustrated in FIG. 3. The multilayer barrier layer was formed not on the whole of the substrate, but formed only on the display part and the periphery thereof by using stencil mask. Consequently, in the obtained barrier layer attached-substrate, no barrier layer was formed on the area between the components and at the outer edge of the substrate. The stencil masks were composed of one for the inorganic layer and one for the organic layer, and they were designed so that the inorganic layer area fully covered the organic layer area and the inorganic layer was formed on the area about 2 millimeters wider than the periphery of the organic layer area.

The mask for the inorganic layer was aligned on the substrate. Then, the substrate was moved into the inorganic film-forming chamber to perform formation of an aluminium oxide film as the first inorganic layer by the sputtering method. The film of aluminium oxide was formed on the substrate using Al metal target with the purity of 5 N by introducing argon gas and oxygen gas. The flat transparent aluminium oxide films having a thickness of about 100 nanometers were obtained.

After forming the first inorganic layers, the mask for the inorganic layer was removed to be exchanged with the mask for the organic layer, and then the substrate was moved into the organic film-forming chamber. The organic monomer material (trade name: Vitex Barix Resin System monomer material (Vitex701), manufactured by Vitex Systems Inc.) was introduced into the vaporizer and was vaporized. Monomer vapor was blown out from the slit nozzle to attach the monomers to the substrate so that the monomers had the even thickness by passing the substrate above the nozzle at the constant speed. Then, the substrate with the monomers was irradiated with UV to cure through crosslinking the monomers, thereby forming the first organic layer. The obtained films of the first organic layer was the flat transparent film having a film thickness of about 1.3 micrometers.

After forming the first organic layer, the substrate was moved into the inorganic film-forming chamber to perform formation of an aluminium oxide film as the second inorganic layer by the sputtering method by introducing argon and oxygen. The flat transparent aluminium oxide film of the second inorganic layer having a thickness of about 80 nanometers was obtained. After forming the second inorganic layer, the second organic layer was formed substantially in the same manner as that of the first organic layer. After the film formation of the second organic layer, the third inorganic layer was formed substantially in the same manner as that of the second inorganic layer. In the same manner, the third organic layer and the fourth inorganic layer were formed to obtain the substrate (the barrier layer-attached substrate) on which a plurality of barrier layers were formed in a predetermined pattern.
(Manufacture of Organic EL Element)

On each of the barrier layers of the barrier layer-attached substrate, the film of ITO (transparent anode), according to a pattern by the mask and having a film thickness of about 150 nanometers, was formed with the opposing target type sputter device. The light-emitting area on the ITO was formed inside each of barrier layer areas. Subsequently, the surface treatment of ITO was performed by $UV-O_3$ apparatus.

The suspension of poly(3,4)ethylenedioxythiophene-polystyrene sulfonic acid (trade name: Bytron P Tp AI 4083, manufactured by H.C. Starck-V TECH Ltd.) was filtered through the filter of 0.5 micrometer diameter. On the surface side of the ITO electrode film formed on each of the barrier layers, the suspension after the filtration was applied by spin-coating to form a film having a thickness of 70 nanometers, and then the film was dried on a hot plate at 200 degrees Celsius for 10 minutes in the air.

Subsequently, a 1.5 percent by weight solution of the polymer organic light-emitting material (trade name: Lumation GP1300, manufactured by Sumation Co Ltd.) was prepared with the solvent in which xylene and anisole were mixed in the ratio of 1:1. This solution was applied on the substrate on which a film of "Bytron P" was previously formed to form a film having a thickness of 80 nanometers by spin coating.

The light-emitting layer in the area between each of the barrier layers and the area at the outer edge of the substrate were removed while remaining the light-emitting layer at the area about 1 millimeter inner from the area of the organic layer of each of the barrier layers (the area includes the light-emitting element area). The substrate was introduced into the vacuum chamber, and then, was moved into the heating chamber (hereinafter, the process was performed under vacuum or nitrogen, so that the element during the process was not exposed to the air). The substrate was heated at the temperature of about 100 degrees Celsius for 60 minutes in vacuum (a degree of vacuum was $1\times10^{-4}$ pascal or less).

Subsequently, the substrate was moved into the vapor deposition chamber to align the substrate with the mask for the cathode. Then, the deposition was performed to form the film for the cathode on the light-emitting area and the output electrode portion. The cathode was formed by: heating Ba metal by a resistance heating method to evaporate the Ba metal at a deposition rate of about 0.2 nm/sec to deposit the film having a thickness of 5 nanometers; and further evaporating Al by an electron-beam evaporation method at a deposition rate of about 0.2 nm/sec to deposit the film having a thickness of 150 nanometers.
(Upper Multilayer Sealing Film)

After forming the light-emitting area of the component in the above described manner, an upper multilayer sealing film was formed substantially in the same manner as that of the multilayer barrier layer by using the film sealing apparatus (trade name: Guardian 200, manufactured by Vitex Systems Inc. in US) without exposing the film from the vacuum chamber to the air. In order to form the upper multilayer sealing films at the same position as that of the multilayer barrier layers, organic and inorganic multilayer sealing films were formed substantially under the same condition as the forming condition of the multilayer barrier layer in which the formation was performed using the masks for the inorganic layer and the organic layer that were used during the formation of the multilayer barrier layer.

Comparative Example

An organic EL light-emitting element was manufactured substantially in the same manner as that in the above mentioned example, except that the multilayer barrier layer and the upper multilayer sealing film were manufactured on the whole surface of the substrate using masks different from the masks for forming the sealing film as in the above example.
(Sealing Performance Comparison)

In the example and the comparative example, after forming the upper multilayer sealing films, the substrates were cut into separate light-emitting element components for mounting. When voltage was applied to drive the components, a light-emitting area of each of the light-emitting components emitted light uniformly.

Subsequently, each of the light-emitting components of the example and the comparative example was stored in the air, and two months later, the components were driven in the same manner. As the result, in the light-emitting components of the example, increase of non-light-emitting area around the periphery of the light-emitting area was less, and the decrease of the light-emitting area was less, compared with those of the comparative example. Therefore, the light-emitting element of the example showed stable light-emitting performance in the air. In other words, it has been confirmed that the lifetime of the light-emitting element of the example was significantly improved compared with the lifetime of the light-emitting element of the comparative example.

INDUSTRIAL APPLICABILITY

As described above, the barrier layer-attached substrate according to the present invention is formed by providing barrier layers in the form of a divided pattern on the substrate. With the use of the barrier layer-attached substrate, a long-life display component can be manufactured. The display component of the present invention has the barrier layer-attached substrate, thereby its lifetime is significantly improved. In addition, since the barrier layer-attached substrate is used in the method, a manufacturing method of the display component according to the present invention can provide a long-life display component.

The invention claimed is:

1. A barrier layer-attached substrate comprising: a substrate, wherein the substrate is a flexible plastic substrate; and barrier layers, wherein
   the barrier layers are formed on the substrate in the form of a plurally divided pattern,
   each of the barrier layers formed on the substrate in the form of a plurally divided pattern comprises a first inorganic layer, an organic layer stacked on the first inorganic layer, and a second inorganic layer stacked on the organic layer so as to cover an edge of the organic layer, in this order from the substrate side,
   the barrier layer-attached substrate has an area, between the barrier layers formed in the plurally divided pattern, having no barrier layer on the surface of the barrier layer-attached substrate, and
   the barrier layer-attached substrate is for use in a display component having a plurality of display elements on the barrier layers.

2. The barrier layer-attached substrate according to claim 1, which is used for an organic EL element.

3. The barrier layer-attached substrate according to claim 1, wherein the barrier layers formed on the substrate in the form of a plurally divided pattern are directly stacked on the substrate or stacked on the substrate with a lyophilic layer interposed therebetween.

4. The barrier layer-attached substrate according to claim 1, wherein the organic layer comprises an acrylic polymer.

5. A display component comprising: a barrier layer-attached substrate in which barrier layers are formed on a substrate, a plurality of display elements which are formed on the barrier layer of the barrier layer-attached substrate, and an upper multilayer sealing film formed on the display elements configured to cover the display elements, wherein the barrier layers are formed on the substrate in the form of a plurally divided pattern, each of the barrier layers formed on the substrate in the form of a plurally divided pattern comprises a first inorganic layer, an organic layer stacked on the first inorganic layer, and a second inorganic layer stacked on the organic layer so as to cover an edge of the organic layer, in this order from the substrate side, and the barrier layer-attached substrate has an area, between the barrier layers formed in the plurally divided pattern, having no barrier layer on the surface of the barrier layer-attached substrate, and wherein the substrate is a flexible plastic substrate.

6. The display component according to claim 5, wherein the display elements and the upper multilayer sealing film are formed on each of the barrier layers in the form of the plurally divided pattern.

7. The display component according to claim 5, wherein the upper multilayer sealing film is a multilayer film comprising at least one inorganic layer and at least one organic layer.

8. The display component according to claim 7, in the upper multilayer sealing film, wherein the inorganic layer stacked at a side opposite to the substrate of the organic layer covers an edge face of the organic layer stacked at a side facing the display elements of the inorganic layer.

9. The display component according to claim 5, which is an organic EL element.

10. A method for manufacturing a display component that has a barrier layer-attached substrate in which barrier layers are formed on a substrate, a plurality of display elements which are formed on the barrier layer of the barrier layer-attached substrate, and an upper multilayer sealing film formed on the display elements configured to cover the display elements, the method comprising:
   forming the barrier layers in the form of a plurally areas divided separately each other,
   wherein each of the barrier layers formed on the substrate in the form of a plurally divided pattern comprises a first inorganic layer, an organic layer stacked on the first inorganic layer, and a second inorganic layer stacked on the organic layer so as to cover an edge of the organic layer, in this order from the substrate side, and
   wherein a flexible plastic substrate is employed as the substrate.

11. The method for manufacturing a display component according to claim 10, comprising: forming the display elements and the upper multilayer sealing film on each of the barrier layers in the form plurally divided.

12. The method for manufacturing a display component according to claim 10, wherein the upper multilayer sealing film was formed by stacking at least one inorganic layer and at least one organic layer.

13. The method for manufacturing a display component according to claim 12, wherein the forming the upper multilayer sealing film comprises stacking the inorganic layer stacked at a side opposite to the display elements of the organic layer so as to cover an edge face of the organic layer stacked at a side facing the display elements of the inorganic layer.

14. The method for manufacturing a display component according to claim 10, comprising: after forming the upper multilayer sealing film, cutting the substrate in each unit divided along the barrier layers, to obtain a display component for use in mounting wherein the substrate is cut along cutting lines in an area having no barrier layer on the surface of the barrier layer-attached substrate.

15. The manufacturing method of a display component according to claim 10, wherein the display component is an organic EL element.

* * * * *